US009655284B2

(12) United States Patent
Milligan et al.

(10) Patent No.: US 9,655,284 B2
(45) Date of Patent: May 16, 2017

(54) MODULAR FAN ASSEMBLY

(71) Applicant: Seagate Technology LLC, Cupertino, CA (US)

(72) Inventors: Gray Daniel Milligan, Golden, CO (US); Anthony John Pronozuk, Loveland, CO (US)

(73) Assignee: Seagate Technology LLC, Cupertino, CA (US)

( * ) Notice: Subject to any disclaimer, the term of this patent is extended or adjusted under 35 U.S.C. 154(b) by 385 days.

(21) Appl. No.: 14/301,783

(22) Filed: Jun. 11, 2014

(65) Prior Publication Data

US 2014/0364048 A1 Dec. 11, 2014

Related U.S. Application Data

(60) Provisional application No. 61/833,647, filed on Jun. 11, 2013.

(51) Int. Cl.
H05K 7/20 (2006.01)

(52) U.S. Cl.
CPC ..... *H05K 7/20736* (2013.01); *H05K 7/20145* (2013.01)

(58) Field of Classification Search
CPC ........... H05K 7/20736; H05K 7/20145; H05K 7/20136; H05K 7/20172; H05K 7/2019; H05K 7/20581; H05K 7/20554; H05K 7/20563; H05K 7/20572; H05K 7/20718; H05K 7/20727; H05K 7/20209; H05K 7/207; H05K 7/20836

USPC ........... 454/184; 361/679.48, 679.49, 679.5, 361/679.51; 237/46
IPC ........................................................ H05K 7/20
See application file for complete search history.

(56) References Cited

U.S. PATENT DOCUMENTS

| | | | | |
|---|---|---|---|---|
| 3,184,275 A * | 5/1965 | Gardner | ............... | H05K 7/2019 312/213 |
| 5,546,272 A * | 8/1996 | Moss | ................... | H05K 7/2019 361/679.48 |
| 5,788,467 A * | 8/1998 | Zenitani | ............ | H05K 7/20581 361/694 |
| 6,025,989 A * | 2/2000 | Ayd | ........................ | G06F 1/183 312/236 |
| 6,141,213 A | 10/2000 | Antonuccio et al. | | |
| 6,459,571 B1 | 10/2002 | Carteau | | |
| 6,496,366 B1 | 12/2002 | Coglitore et al. | | |
| 6,592,449 B2 * | 7/2003 | Cipolla | ..................... | G06F 9/52 236/49.1 |
| 6,958,906 B2 | 10/2005 | Wu et al. | | |
| 7,068,506 B2 * | 6/2006 | Behl | ........................ | G06F 1/20 174/16.3 |
| 7,286,345 B2 | 10/2007 | Casebolt | | |

(Continued)

*Primary Examiner* — Gregory Huson
*Assistant Examiner* — Daniel E Namay
(74) *Attorney, Agent, or Firm* — Hall Estill Attorneys at Law

(57) ABSTRACT

A modular fan assembly for use in a multi-device storage enclosure. In some embodiments, the fan assembly has a rigid open frame with opposing first and second ends. A first fan is connected to the first end and a second fan is connected to the second end. The first and second fans are configured to establish a fluidic airflow through the frame. An airflow diverter positioned in an intermediate portion of the frame between the first and second ends divert at least a portion of the fluidic airflow through a first aperture of the frame to cool an active element outside the frame.

20 Claims, 9 Drawing Sheets

(56) References Cited

U.S. PATENT DOCUMENTS

| | | | |
|---|---|---|---|
| 7,305,458 B2 | 12/2007 | Hsue et al. | |
| 7,418,623 B2 | 8/2008 | Elliott et al. | |
| 7,536,586 B2 | 5/2009 | Ahmadian et al. | |
| 7,568,122 B2 | 7/2009 | Mechalke et al. | |
| 7,862,410 B2 * | 1/2011 | McMahan | H05K 7/20736 454/184 |
| 7,877,626 B2 | 1/2011 | Piszczek et al. | |
| 8,010,713 B2 | 8/2011 | Matumura et al. | |
| 8,094,451 B2 * | 1/2012 | Bellin | G06F 1/20 361/694 |
| 8,296,406 B2 | 10/2012 | Kasperson et al. | |
| 8,373,986 B2 * | 2/2013 | Sun | G06F 1/20 165/104.33 |
| 8,411,447 B2 * | 4/2013 | Turner | H05K 7/207 361/730 |
| 8,636,565 B2 * | 1/2014 | Carlson | G06F 1/20 361/691 |
| 8,705,235 B2 * | 4/2014 | Wang | G06F 1/20 165/121 |
| 8,830,673 B2 * | 9/2014 | Kuo | H05K 7/20172 312/236 |
| 2002/0094772 A1 * | 7/2002 | Gough | H05K 7/20172 454/184 |
| 2003/0112601 A1 * | 6/2003 | Smith | G06F 1/183 361/695 |
| 2007/0081888 A1 * | 4/2007 | Harrison | F04D 19/007 415/47 |
| 2007/0207721 A1 * | 9/2007 | Chang | H05K 7/20209 454/184 |
| 2007/0230110 A1 | 10/2007 | Starr et al. | |
| 2007/0243814 A1 * | 10/2007 | Makabe | H05K 7/20736 454/184 |
| 2008/0104985 A1 * | 5/2008 | Carlsen | F24F 11/0009 62/228.4 |
| 2009/0030554 A1 * | 1/2009 | Bean, Jr. | F25B 49/02 700/276 |
| 2009/0190301 A1 * | 7/2009 | Huang | H05K 7/20736 361/679.46 |
| 2009/0231800 A1 | 9/2009 | Franz et al. | |
| 2009/0294107 A1 * | 12/2009 | Nishiyama | G06F 1/187 165/104.34 |
| 2011/0060471 A1 * | 3/2011 | Aggus | G06F 1/20 700/282 |
| 2011/0122572 A1 * | 5/2011 | Cheng | H05K 7/20736 361/679.48 |
| 2011/0149525 A1 * | 6/2011 | Turner | H05K 7/207 361/730 |
| 2011/0207392 A1 * | 8/2011 | Ebermann | H05K 7/20836 454/184 |
| 2012/0111533 A1 * | 5/2012 | Chen | H05K 7/20736 165/80.2 |
| 2012/0111534 A1 * | 5/2012 | Chen | H05K 7/20736 165/80.3 |
| 2012/0113592 A1 * | 5/2012 | Chen | H05K 7/1488 361/695 |
| 2012/0224325 A1 * | 9/2012 | Sun | H05K 7/20145 361/695 |
| 2012/0325127 A1 | 12/2012 | Adrain | |
| 2013/0065501 A1 * | 3/2013 | Wang | H05K 7/20181 454/184 |
| 2013/0109288 A1 * | 5/2013 | Tang | H05K 7/20736 454/184 |
| 2013/0151769 A1 | 6/2013 | Childs et al. | |
| 2013/0152376 A1 | 6/2013 | Corddry et al. | |
| 2013/0210334 A1 * | 8/2013 | Tan | H05K 7/20727 454/184 |
| 2013/0219101 A1 | 8/2013 | Hansen et al. | |
| 2013/0295834 A1 * | 11/2013 | Faist | H05K 7/20736 454/184 |
| 2013/0337735 A1 * | 12/2013 | Peterson | F04D 29/582 454/184 |
| 2014/0078668 A1 * | 3/2014 | Goulden | H05K 7/20736 361/679.47 |
| 2014/0113539 A1 * | 4/2014 | Dickinson | H05K 7/20581 454/184 |
| 2014/0179214 A1 * | 6/2014 | Rinke | H05K 7/20836 454/184 |
| 2014/0206271 A1 * | 7/2014 | Ignacio | H05K 7/20736 454/184 |
| 2014/0365743 A1 * | 12/2014 | Pronozuk | G06F 3/0623 711/166 |
| 2016/0050795 A1 * | 2/2016 | Conn | H05K 7/1485 454/184 |

\* cited by examiner

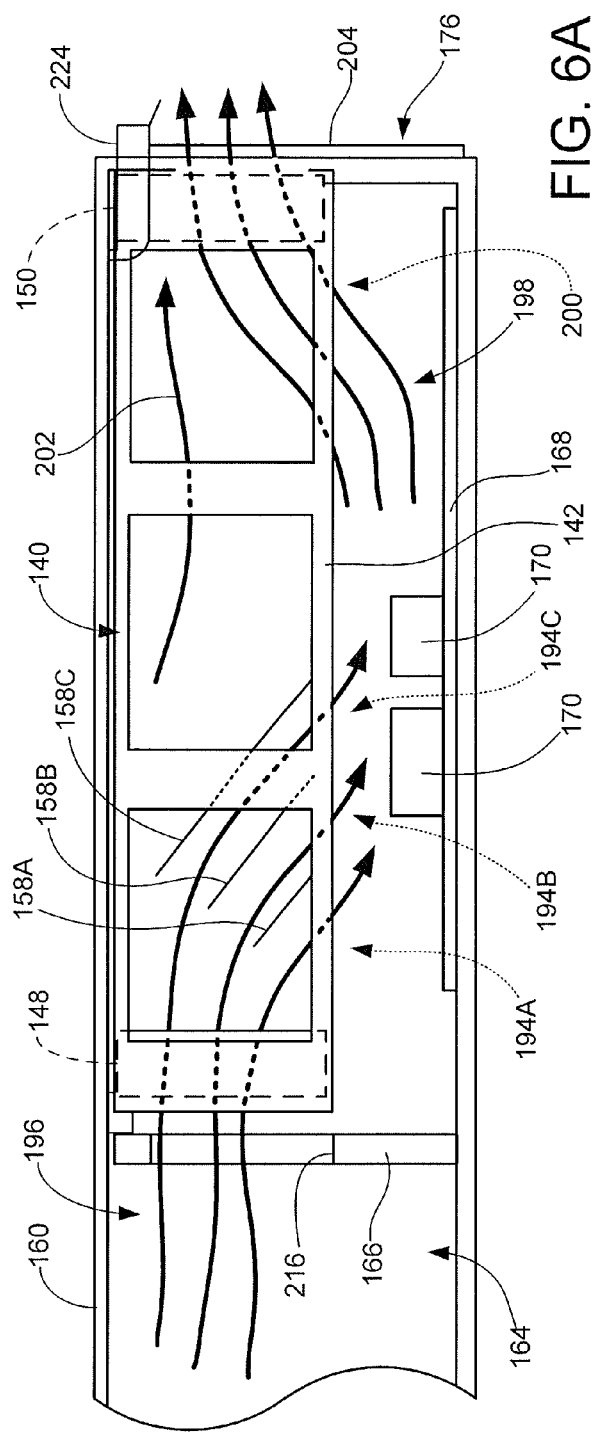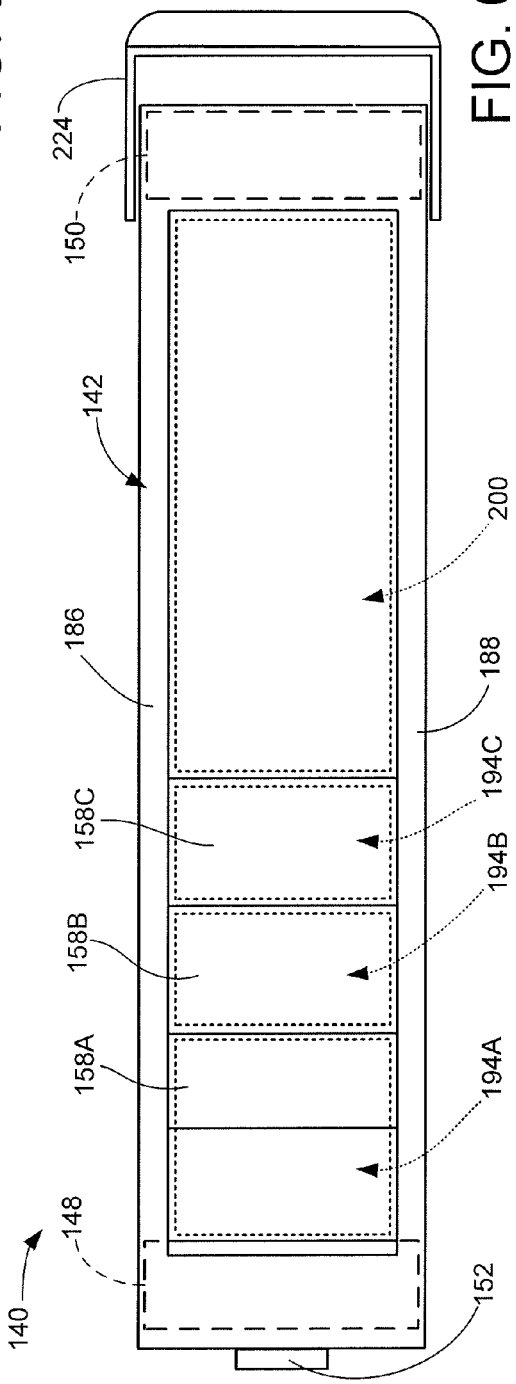

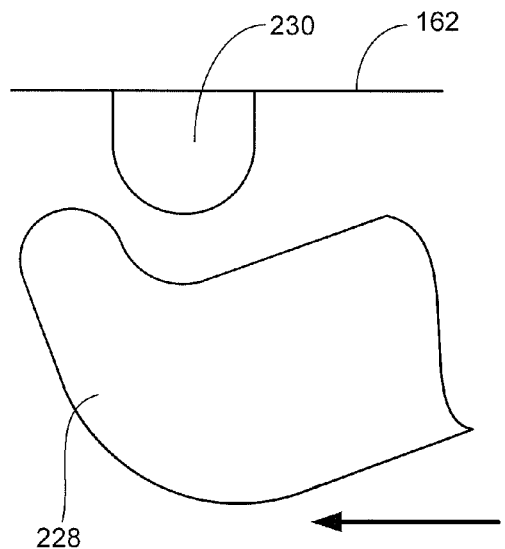
FIG. 10A
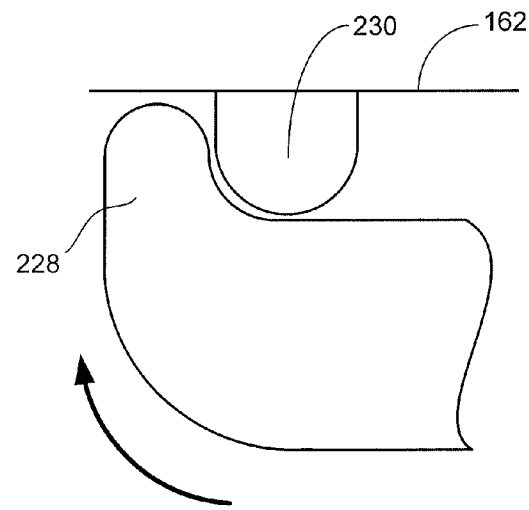
FIG. 10B
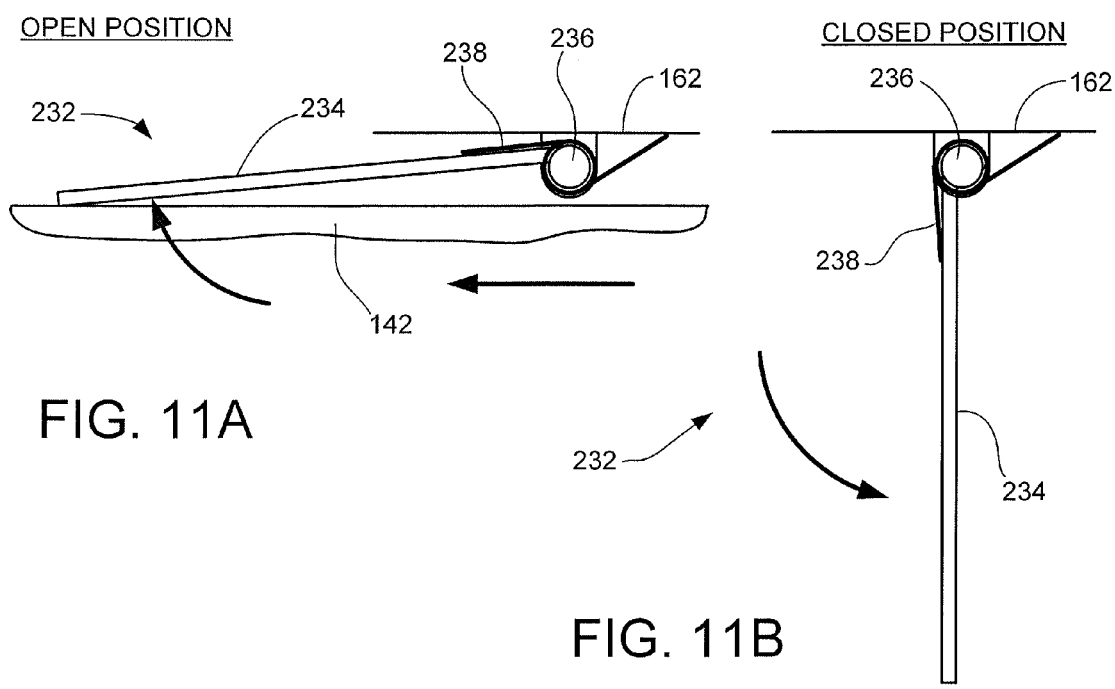
FIG. 11A
FIG. 11B

MODULAR FAN ASSEMBLY

RELATED APPLICATION

This application makes a claim of domestic priority to U.S. Provisional Patent Application No. 61/833,647 filed Jun. 11, 2013, the contents of which are hereby incorporated by reference.

SUMMARY

Various embodiments of the present disclosure are generally directed to a modular fan assembly for use in a housing, such as a housing of a multi-device storage enclosure.

In accordance with some embodiments, the fan assembly has a rigid open frame with opposing first and second ends. A first fan is connected to the first end and a second fan is connected to the second end. The first and second fans are configured to establish a fluidic airflow through the frame. An airflow diverter positioned in an intermediate portion of the frame between the first and second ends divert at least a portion of the fluidic airflow through a first aperture of the frame to cool an active element outside the frame.

BRIEF DESCRIPTION OF THE DRAWINGS

FIG. 6A is a side elevational depiction of the fan assembly during operation.

FIG. 6B shows a bottom plan view of the fan assembly of FIG. 6A.

FIGS. 10A and 10B show details concerning a latch mechanism used to secure and mate each of the fan assemblies.

FIGS. 11A and 11B are side elevational representations of a spring-biased sealing door used in conjunction with each fan assembly in some embodiments.

DETAILED DESCRIPTION

Figure 1:
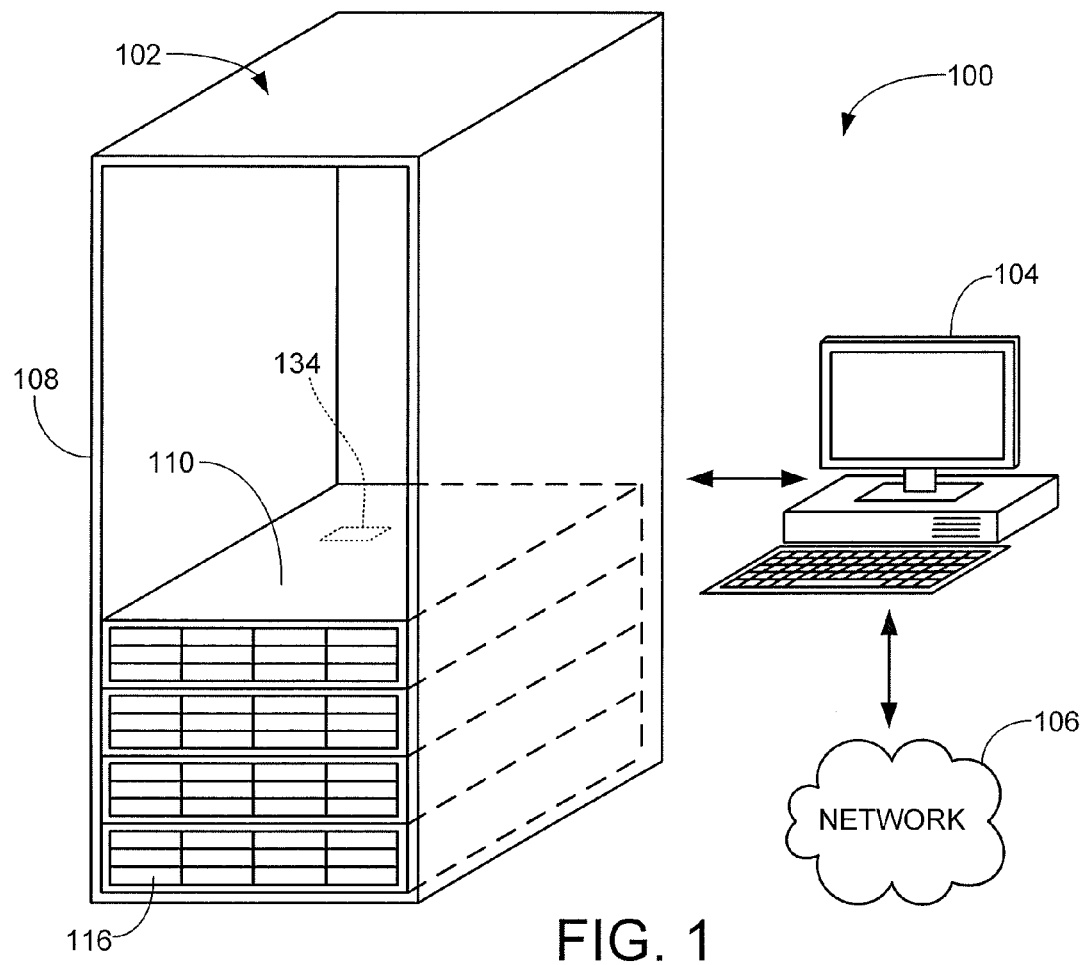
FIG. 1 is a functional representation of a networked mass storage system to illustrate a suitable operational environment for various embodiments of the present disclosure.

The present disclosure generally relates to directed cooling systems, such as a system for internal cooling of a housing of a multi-device storage enclosure of a mass storage system.

Mass storage systems often employ multiple data storage devices which are operationally arranged to provide a relatively high data capacity memory storage space. The devices may be grouped together into a mass storage assembly (MSA) or other module that can be removably installed into a rack system (server cabinet).

Mass storage systems can take a variety of forms including servers, cloud storage modules, RAID (redundant array of independent discs) systems, extended memory systems (JBODs, or "just a box of drives"), etc. The storage systems can be accessed locally or over a network including a local area network (LAN), a wide area network (WAN), the Internet, etc. The storage devices may be individually addressable via IP addresses through a suitable communication protocol (e.g., Ethernet, etc.). A rack-mountable storage enclosure can include the storage devices as well as a number of other active elements such as storage devices, control boards, power supplies, fans, boot devices, etc.

While operable to provide highly efficient computer storage, conventional mass storage systems can be subject to a variety of limitations, including the inability to remove and replace individual active elements while maintaining the storage enclosure in a powered, operational condition ("hot swapping"), such as in the context of a service operation to replace a failed component or an upgrade operation where new and different performance elements are installed.

Accordingly, various embodiments of the present disclosure are generally directed to a modular fan assembly suitable for use in a housing, such as but not necessarily limited to a housing of a multi-device storage enclosure. As explained below, some embodiments provide a storage enclosure configured with a housing adapted to be mounted within a rack system between a cold aisle (front) and a warm aisle (rear). The housing supports a number of active elements including multiple storage devices, power supplies, control boards, boot devices, etc.

A modular fan assembly provides cooling for the various active elements. In some embodiments, the fan assembly has a rigid open frame with opposing first and second ends. A first fan is connected to the first end of the frame, and a second fan is connected to the second end of the frame. The first and second fans are configured to establish a fluidic airflow through the frame. An airflow diverter is positioned in an intermediate portion of the frame between the first and second ends to divert at least a portion of the fluidic airflow through a first aperture of the frame to cool an active element outside the frame.

In further embodiments, the fan assembly is slidingly installed through the rear of the storage enclosure housing so that the first fan is proximate an intermediate portion of the housing and the second fan is proximate the rear of the storage enclosure housing. This allows cooling air to be drawn from the cold aisle and passed adjacent the storage devices and into the open frame. When the storage enclosure utilizes a midplane, the fan assembly can include a connector that matingly engages a connector supported by the midplane during installation of the fan assembly. One or more apertures can be provisioned in the midplane to allow passage of the airflow from the storage devices.

A latching mechanism with a handle and a cam arrangement can be used to securely engage and seat the fan assembly with the storage enclosure housing. A spring-biased sealing door can be configured to be deflected out of the way to an open position upon installation of the fan assembly. The sealing door can transition to a closed position to seal an aperture at the rear of the storage enclosure housing upon the removal of the fan assembly during a service event.

In this way, cooling fans can be located near intermediate portions of the interior of the housing to enhance cooling efficiencies, and such cooling fans can be quickly and easily removed and replaced via hot-swapping (e.g., without the need to power down the active elements within the housing).

These and other features of various embodiments will become apparent beginning with a review of FIG. 1 which generally depicts a networked mass storage system 100 in accordance with some embodiments. The system 100 includes a storage assembly 102 coupled to a computer 104 which in turn is connected to a network 106. The computer 104 can take a variety of forms such as a work station, a local personal computer, a server, etc. The storage assembly 102 includes a server cabinet (rack) 108 and a plurality of modular storage enclosures 110.

In some embodiments, the storage rack 108 is a 42U server cabinet with 42 units (U) of storage, with each unit comprising about 1.75 inches (in) of height. The width and length dimensions of the cabinet can vary but common values may be on the order of about 24 in.×36 in. Other sizes can be used. Each storage enclosure can be a multiple of the storage units, such as 2 U, 3 U, 5 U, etc. Fully populating the rack 108 with storage enclosures 110 can provide several Petabytes ($10^{15}$ bytes) of storage or more for the computer 104 and/or network applications.

Figure 2:
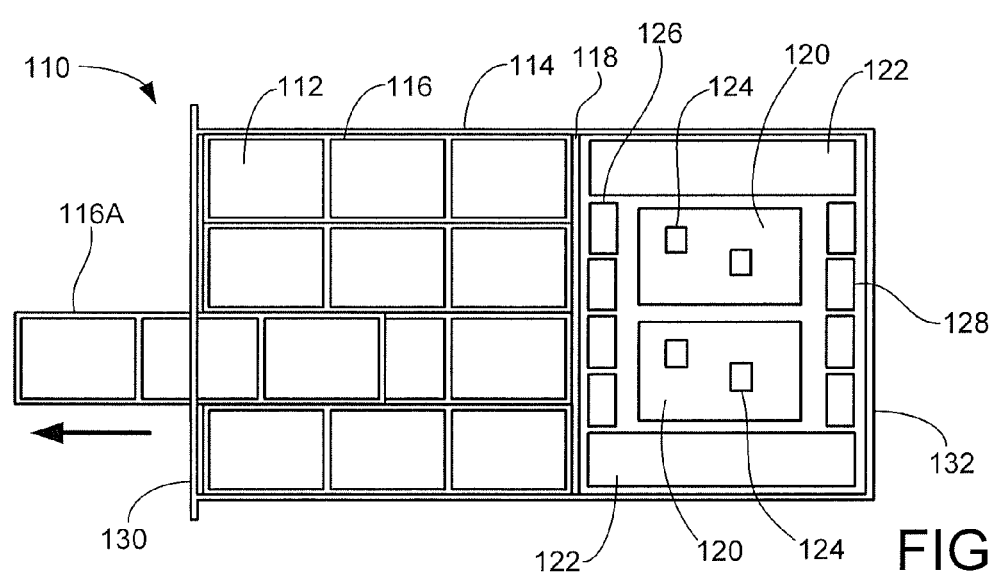
FIG. 2 is a top plan representation of a storage enclosure from FIG. 1.

An example configuration for a selected storage enclosure 110 is shown in FIG. 2. The storage enclosure 110 takes a 36/2 U configuration with 36 (3×4×3) data storage devices 112 in a 2 U form factor height storage enclosure housing 114. A variety of other configurations can be used including storage enclosures with a total of N drives where N=12, 16, 20, 24, 30, 32, 48, etc. Other heights can be used as well, such as 3 U, 4 U, 5 U, etc. While 1 U height storage enclosures are contemplated, it has been found in some cases that a thicker enclosure housing (e.g., 2 U or greater) provides improved structural stability and vibration response.

The storage devices 112 can take a variety of forms, such as hard disc drives (HDDs), solid-state drives (SSDs), hybrid drives, etc. Each storage device 112 includes a controller and computer memory to provide storage of user data. In a cloud computing environment, data may be stored in the form of objects (partitions) of selected size and duplicated a number of times in different zones in different storage devices. It is contemplated that the storage devices 112 in FIG. 2 are 3.5 inch (in.) form factor HDDs with nominal length and width dimensions of 5.75 in.×4.0 in. Other styles and form factors of storage devices can be used, including but not limited to 2.5 in. form factor devices with nominal dimensions of 4.0 in.×2.88 in.

Retractable sleds 116 are used to secure multiple sets of the storage devices 112. The sleds can be individually extended and retracted from the housing 114, as shown for a selected sled 116A which has been partially extended from the housing 110. The sleds 116 may include sled electronics (not separately shown) to provide status indications and other control features during enclosure operation. While the sleds 116 are shown to support the storage devices 112 in a horizontal orientation (e.g., the length and width dimensions of the storage devices are parallel to the overall length and width dimensions of the storage enclosure housing 114), the sleds 116 can alternatively support the storage devices 112 in a vertical orientation (e.g., "on edge" so that the length and width dimensions of the storage devices are orthogonal to the length and width dimensions of the storage enclosure).

A midplane 118 extends in a transverse direction across the housing 114 to provide electrical interconnection paths for the various storage devices 112 and sled electronics. The midplane may take the form of a fixed multi-layer printed circuit board assembly (PCBA) with various electrical connectors, signal traces and vias to establish the necessary electrically conductive signal and power paths.

Alternatively, the midplane may take a flexible configuration in which flex circuits (e.g., cables, etc.) are used to maintain electrical interconnection with the storage devices and sleds. When a rigid midplane is used, extension of a sled (e.g., sled 116A) will generally result in the associated storage devices on the extended sled being powered down and disconnected from the system. Extension of a sled using a flexible midplane may allow the associated storage devices in the extended sled to remain powered up and operational.

Other active elements in the storage enclosure 110 of FIG. 2 include dual redundant control boards 120. The control boards 120 can take a variety of forms depending on the configuration of the storage enclosure 110, such as a server, a network switch, a router, a RAID controller, etc. The multiple control boards can be used in a dual mode operation to support failover and failback operations, or as a master/slave arrangement so that one control board provides control operations and the other board operates in a standby mode ready to take over operation should a fault be detected in the main control board.

Dual redundant power supplies are represented at 122. The power supplies 122 provide electrical power for the control boards 120 and other active elements of the storage enclosure 110 such as the storage devices 112. The electrical power is supplied at suitable voltage levels (e.g., 3V, 5V, 12V, etc.). Redundancy is provided such that each power supply 122 is rated to supply power for the entire enclosure, should the remaining power supply or supplies be temporarily taken off line.

The control boards 120 include one or more integrated circuit (IC) devices 124. The IC devices 124 generate significant amounts of heat during operation, requiring the use of active cooling to maintain the devices in a suitable temperature range. Similarly, the storage devices 112 can generate significant amounts of heat during operation depending upon system loading.

Accordingly, the storage enclosure 110 further incorporates a number of electrical fans. Forward located fans 126 are provisioned near the midplane 118 at an intermediate location within the storage enclosure housing 114, and rearward located fans 128 are provisioned at the rear of the storage enclosure housing 114. The respective fans 126, 128 may be nominally identical or may be provided with different operational characteristics.

Although not separately denoted in FIG. 2, it will be understood that vent apertures are provisioned in respective front and end facing surfaces 130, 132 of the storage enclosure housing 114. The apertures permit cooling airflow from the cold aisle to be drawn into the front of the housing 114 so as to flow adjacent the storage devices 112 and midplane 118, through the front fans 126, adjacent the control boards 120 and power supplies 122, and through the rear fans 128 out the rear of the housing to the warm aisle. The power supplies 122 may similarly incorporate fans to direct airflow through the power supply housing.

While such an arrangement can be operable, the location of the front fans 126 within the intermediate portion of the housing can present challenges from a servicing standpoint should one or more of the fans require replacement. As noted above, the use of the retractable sleds 116 permits relatively easy access to the individual storage devices 112. Similarly, the other active elements such as the control boards 120, the power supplies 122 and the rear fans 128 can be easily accessed through the rear side 132 of the housing 114.

Due to clearance and interconnectivity constraints, however, the front fans 126 are not easily accessible from either the front or rear sides 130, 132 of the housing 114. In the event of a failure of one or more of the front fans 126, one service option is to remove the rear fans 128 and one or both of the control boards 120 from the rear of the housing 114 in order to reach in, remove and replace the failed fan(s) 126. This requires the storage enclosure to be powered down for a significant amount of time and provides a risk that one or more of the active components may be damaged or reinstalled improperly.

Another service option is to mount the storage enclosure 110 on a set of rails, allowing the storage enclosure to be extended forward from the storage cabinet 108 (see FIG. 1). A service door (such as represented at 134 in FIG. 1) in the top cover of the storage enclosure housing 114 can then be opened to provide access to the forward fans 126. This approach is also associated with a number of difficulties, including the fact that the storage enclosure will likely need to be powered down prior to extension. Depending on the size and number of storage devices within the enclosure, the enclosure can also be unwieldy from a weight standpoint (some storage enclosures can weigh several hundred pounds), making such service operations difficult to carry out in a fast and efficient manner.

Accordingly, various embodiments of the present disclosure are directed to a novel modular fan assembly 140 which overcomes these and other limitations of the associated art. A schematic depiction of the fan assembly 140 is provided in FIG. 3 to point out various features of interest which will be discussed in greater detail in the ensuing drawings. It is contemplated that multiple adjacent fan assemblies 140 may be utilized in a storage enclosure such as 110 in FIG. 2.

The fan assembly 140 includes a rigid open frame 142 with a first end 144 and an opposing second end 146. A first fan 148 is supported adjacent the first end 144 of the frame and a second fan 150 is supported adjacent the second end 146 of the frame. The first and second fans 148, 150 cooperate to generate a fluidic airflow through the frame in a direction from the first end 144 and toward the second end 146.

A power connector 152 is mounted to the frame 142 and electrical conduits 154, such as in the form of power cables, etc., are routed along the frame to supply electrical power and control signals from the connector 152 to the respective fans 148, 150. A latch mechanism 156 engages the storage enclosure housing to secure the fan assembly 140 and ensure mating connection of the connector.

An airflow diverter 158 is supported by the frame 142 at a medial location between the first and second ends 144, 146. The airflow diverter 158 directs at least a portion of the airflow established by the fans away from the open frame so as to provide cooling to an active element located outside the frame.

Figure 4:
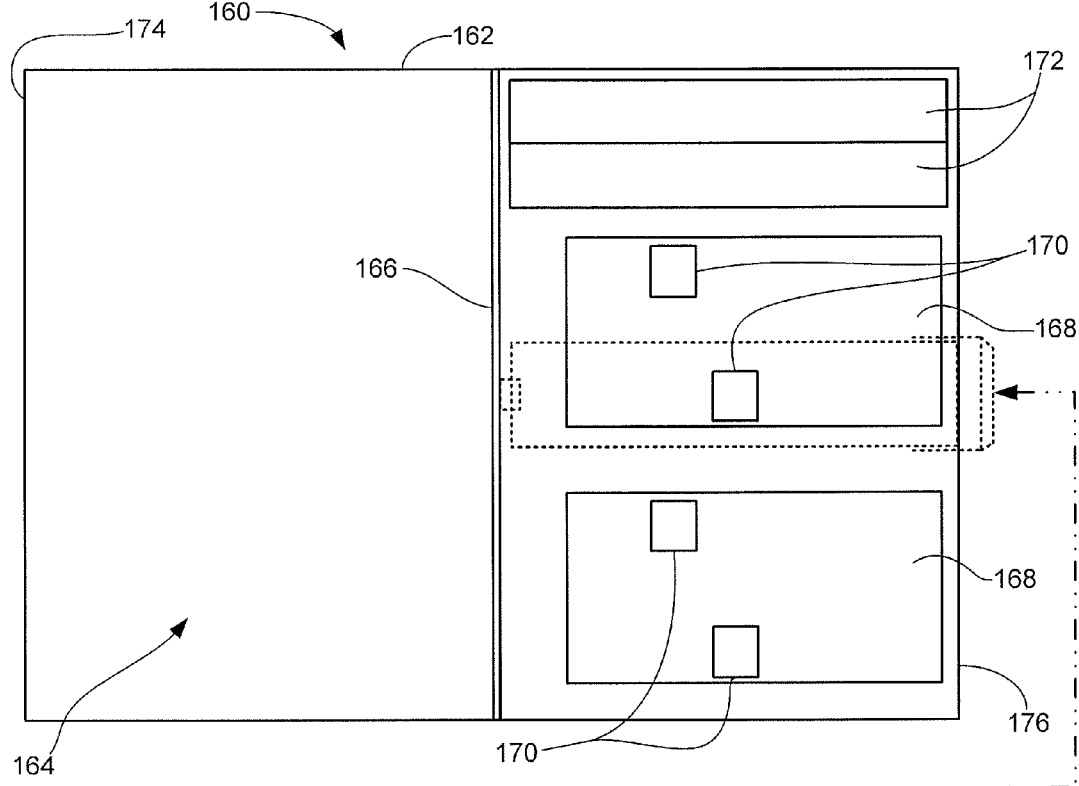
FIG. 4 illustrates the fan assembly from FIG. 3 in conjunction with a storage enclosure in accordance with some embodiments.

FIG. 4 is a top plan view of the modular fan assembly 140 in conjunction with a storage enclosure 160 in accordance with some embodiments. The storage enclosure 160 includes a storage enclosure housing 162 which houses various active elements of interest. The storage enclosure 160 is sized to fit within a storage cabinet (e.g., 108, FIG. 1) and accommodate a number of data storage devices (not shown) which fit within a storage device zone 164. The configuration and layout of the storage devices have been omitted for clarity of illustration, but such can correspond to those discussed above for the storage enclosure 110.

A midplane 166 spans the storage enclosure housing 162 in a transverse direction. The midplane 166 is characterized as a rigid midplane, but such is merely exemplary and is not necessarily limiting. Redundant control boards 168 support high power consumption IC devices 170, and redundant power supplies 172 supply electrical power for the enclosure 160.

The storage enclosure housing 162 includes opposing front and rear facing sides 174, 176. The fan assembly 140 is configured for sliding insertion into the housing 162 through an access aperture extending through the rear side 176, as shown.

Figure 5:
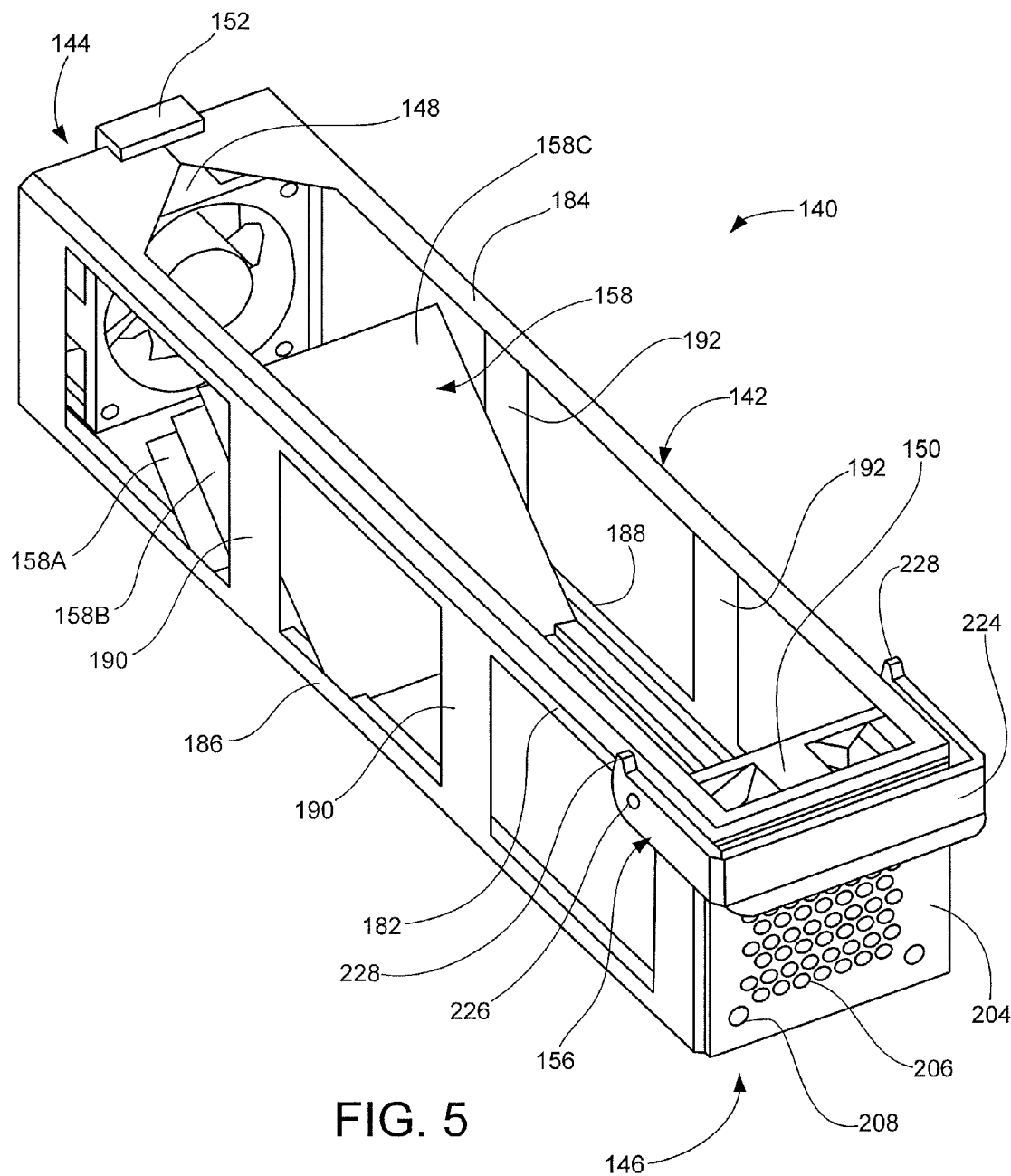
FIG. 5 is an isometric depiction of the fan assembly of FIG. 4.

FIG. 5 provides an isometric view of the modular fan assembly 140 from FIG. 4. The frame 142 has a rectilinear configuration with elongated top support rails 182, 184 and elongated bottom support rails 186, 188 forming respective corners of the frame 142. The support rails extend the length of the fan assembly 140 in a horizontal direction to mechanically connect and align the first (forward) fan 148 to the second (rear) fan 150.

Support ribs 190 extend vertically between support rails 182, 186 and support ribs 192 extend vertically between support rails 184, 188. No support ribs are shown across the medial portions of the top or bottom extents of the frame (e.g., between rails 182, 184 and between rails 186, 188) although such additional ribs can be provided as desired. It will be appreciated that the open frame 142 can take a number of alternative configurations apart from that depicted in FIG. 5.

In one embodiment, at least half (50%) of the overall surface area of the volumetric expanse defined by the frame between the fans is open, as exemplified by FIG. 5. That is, excluding the surface areas of the first and second ends 144, 146, the remaining surfaces (top, bottom, left side, right side) of the volumetric expanse defined by the frame are provided with through apertures between the interior and exterior of the frame so that a combined areal extent of the apertures is greater than the combined areal extent of the solid frame members (e.g., rails 182, 184, 186, 188 and ribs 190, 192). Other values can be used, however, such as from about 10% to about 80% or more of the overall area of these surfaces being open.

It will be appreciated that closing off different sides (or portions thereof) of the sides of the frame can enhance directional airflow through the enclosure, but this can also reduce the extent to which the airflow generated by the fan assembly passes outside (and back into) the frame. As used herein, an "open frame" will be understood to have at least about 10% open sides as discussed above.

Figure 3:
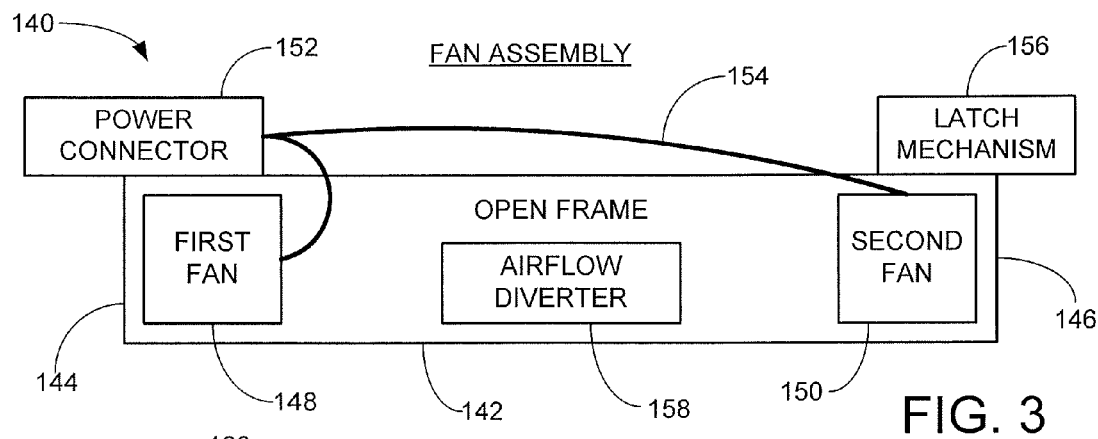
FIG. 3 is a schematic diagram of a modular fan assembly constructed and operated in accordance with various embodiments.

The airflow diverter 158 from FIG. 3 is shown in FIG. 5 to comprise three adjacent, parallel airfoils 158A, 158B and 158C in spaced-apart relation supported between the lower rails 186, 188. Each of the airfoils comprises a planar rigid material that extends at a selected angle, such as nominally 45 degrees, with respect to the rails 186, 188. The angle of the airfoils can be any suitable acute angle with respect to the rails configured to divert at least a portion of the airflow established by the fans 148, 150 in the intended direction. As further shown in FIGS. 6A and 6B, the airfoils 158A, 158B, 158C define three adjacent apertures 194A, 194B and 194C through the bottom of the frame 142. Each of the apertures is bounded by the opposing bottom rails 186, 188. The first aperture 194A further extends between the fan 148 and the first airfoil 158A. The second aperture 194B extends between the airfoils 158A and 158B, and the third aperture extends between the airfoils 158B and 158C.

The airfoils serve to divert at least a portion of an inlet airflow, represented by arrow 196, through the apertures 194A, 194B, 194C so as to pass outside of the frame 142. As shown in FIG. 6A, the diverted airflow passes adjacent the IC devices 170 on the adjacent control board 168, although other active elements can be cooled. Each of the airfoils 158A, 158B and 158C are shown to have a substantially linear planar configuration. Other configurations are contemplated, such as but not limited to continuously curvilinear planar configurations and segmented linear planar configurations with different segments extending at different respective angles with respect to the rails 186, 188.

A return airflow, represented by arrows 198, passes back into the interior of the open frame 142 through a return aperture 200 defined by the bottom side rails 186, 188 and extending between the airfoil 158C and the second fan 150. While it is contemplated that a large portion of the overall airflow established by the fan assembly 140 will thus pass through the respective apertures 194A-194C and 200, an additional airflow represented by arrow 202 may take another path through the frame 142 to provide cooling to other portions of the enclosure. Additional features, such as a second set of airfoils, etc. can be used to further direct the respective airflows generated by the fan assembly 140 to achieve desired levels of cooling based on the requirements of a given application.

Referring again to FIG. 5, it can be seen that the second (rear) end 146 of the frame 142 can be provided with a protective cover plate 204. The protective cover plate 204 includes an array of relatively small apertures 206 through which the return flow 198 passes (see FIG. 6A). Fasteners 208 can be used to secure the cover plate 204, and as desired the fan 150, to the frame 142. Similar fasteners and cover plates can be used on the front facing side 144 of the frame 142 as desired.

Figure 7:
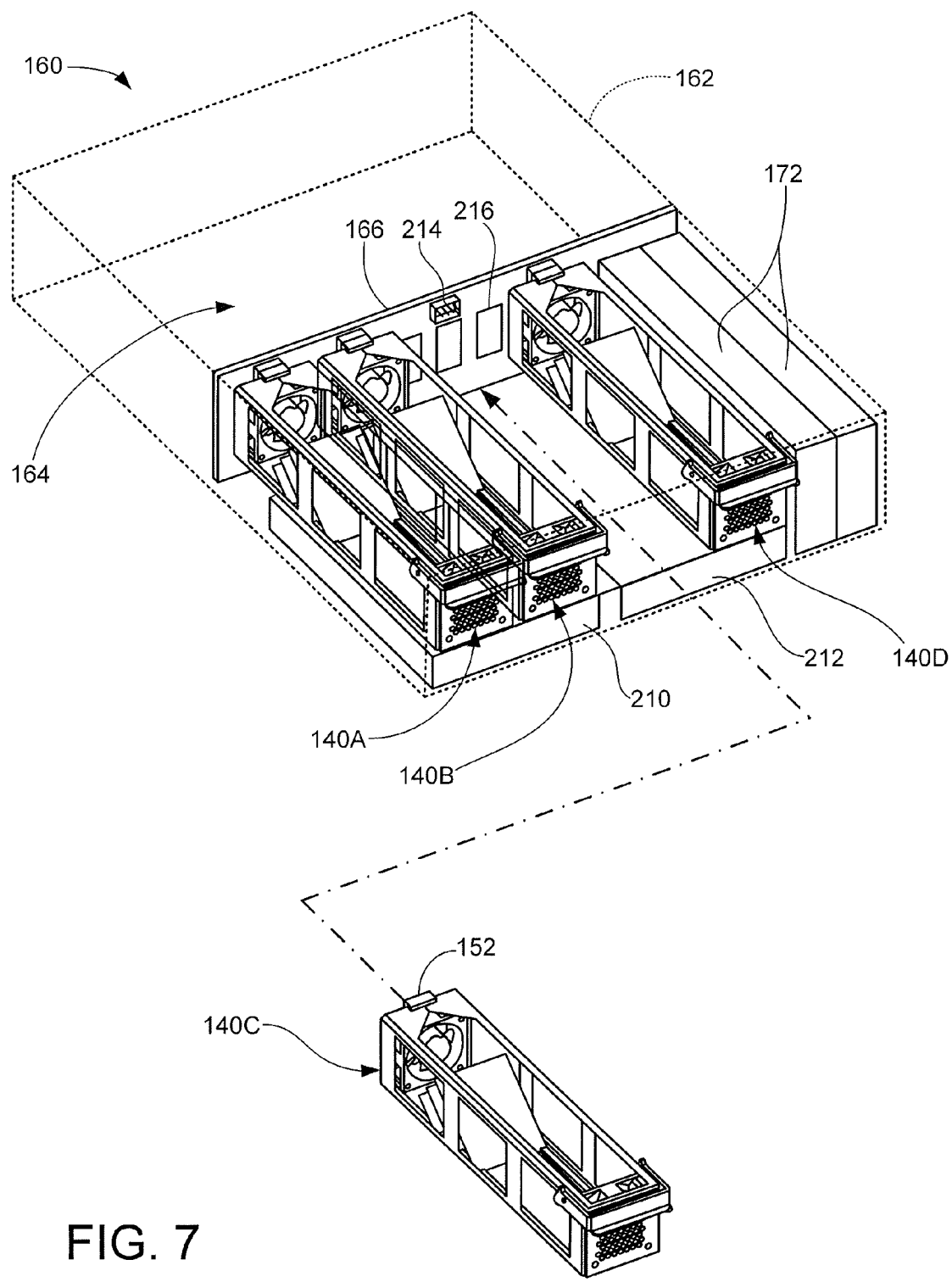
FIG. 7 depicts the use of multiple adjacent modular fan assemblies.

FIG. 7 shows a total of four (4) modular fan assemblies nominally identical to the fan assembly 140 of FIGS. 4-6. The fan assemblies are respectively identified as fan assemblies 140A, 140B, 140C and 140D. Fan assemblies 140A, 140B and 140D are shown in an installed orientation, and fan assembly 140C is shown in a removed orientation. For reference, the control boards 168 can be supported within removable trays 210, 212 located below adjacent pairs of the fan assemblies. In this way, the first two fan assemblies 140A, 140B can provide primary cooling for the control board 168 supported in tray 210, and the second two fan assemblies 140C, 140D can provide primary cooling for the control board 168 supported in tray 212.

The rigid midplane 166 includes spaced apart electrical connectors to matingly engage the fan assemblies. The midplane connector for the fan assembly 140C is denoted at 214. The respective connectors 152, 214 can take any suitable configuration including pins, spring clips, traces, etc. Guide mechanisms can be used to help ensure proper alignment of the respective connectors during seating operations.

Figure 8A:
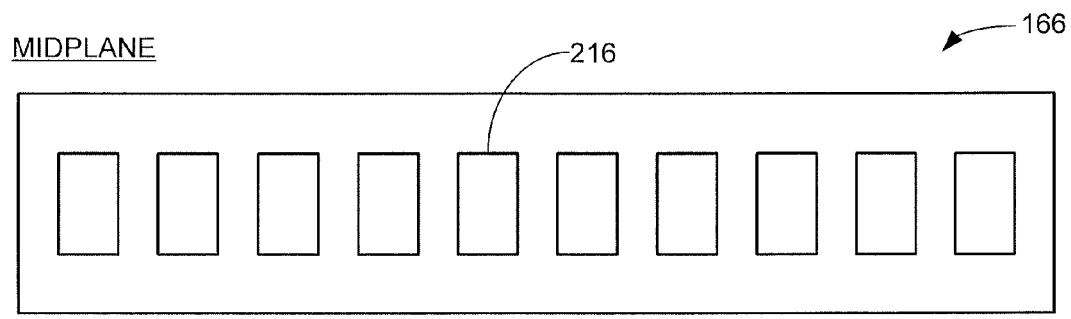
FIGS. 8A and 8B show different example configurations for a midplane of the storage enclosure of FIG. 7.

The midplane 166 is further shown to include a number of spaced apart apertures 216. The apertures extend through the midplane 166 to facilitate airflow from the storage device zone 164 and into the fan assemblies. FIG. 8A shows the midplane 166 in greater detail (the midplane connectors 214 have been omitted for clarity of illustration). A total of 10 apertures 216 extend through medial portions of the midplane 166, although other numbers, locations and shapes of the apertures can be provided.

Figure 8B:
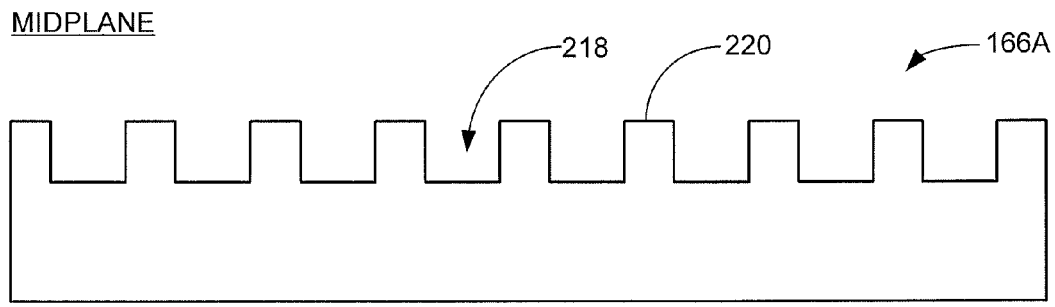

FIG. 8B shows an alternative rigid midplane 166A with a turret configuration. Apertures 218 extend between adjacent projections 220 to allow airflow to pass therethrough. The overall height of the midplane can be adjusted to facilitate passage of airflow from the data storage device zone 164.

Figure 9:
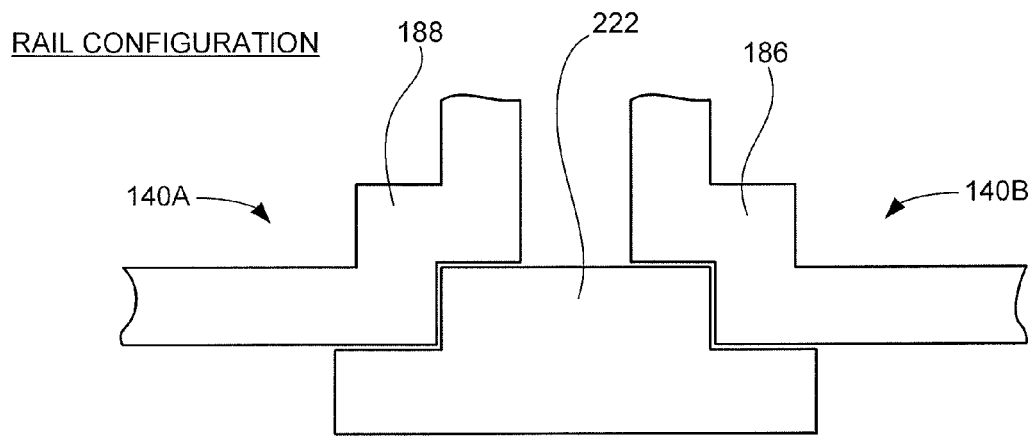
FIG. 9 illustrates a rail configuration used to support the fan assemblies of FIG. 7.

Guide rails such as depicted at 222 in FIG. 9 can be aligned to support the fan assemblies along the lengths thereof The guide rail 222 is shown to be disposed between fan assembly 140A and fan assembly 140B. The guide rail 222 provides top and side guide surfaces to slidingly engage and support corresponding notches in the respective bottom support rail 188 of fan assembly 140A and bottom support rail 186 of fan assembly 140B. Other configurations for the guide rails used to support the fan assemblies can be used, including configurations that utilize rollers, low friction sliding plates, spring biased tracks, etc. Generally, the rails are intended to provide sufficient guidance for the fan assemblies during sliding insertion therein to ensure proper alignment and engagement with the midplane connectors (e.g., 214, FIG. 7).

Referring again to FIG. 5, the latch mechanism 156 is disposed adjacent the second (rear) end 146 of the frame 142 to facilitate removal and installation of the fan assembly 140. The latch mechanism 156 includes a hinged handle member 224 that pivots about corresponding pivot shafts 226 on opposing sides of the frame 142. A cam member 228 extends from the handle 224 at a distal end thereof.

As shown by FIGS. 10A and 10B, during insertion of the fan assembly 140 the handle 244 is raised relative to frame 142 to permit sliding passage of the cam member 228 past a locking tab 230 which is supported by the storage enclosure housing 162. The user then lowers the handle 224, bringing the cam member 228 into contacting engagement with a cam surface of the locking tab 230, which advances the fan assembly 140 forward and locks the fan assembly into place.

It is contemplated that the engagement between the cam member 228 and the tab 230 may be used to supply the requisite insertion force to fully mate the fan assembly connector 152 with the midplane connector 214 (see FIG. 7). However, in other embodiments the electrical interconnection of the fan assembly 140 with the requisite power source (e.g., power supplies 172) is carried out independently of the securement and locking supplied by the latch mechanism 156. For example, the user can latch the fan assembly 140 into place and then manually connect a "dangling" connector of the fan assembly to a corresponding available connector from the power supplies to electrically interconnect the fans 148, 150 for operation. These and other alternatives will be readily apparent to the skilled artisan in view of the present disclosure.

To subsequently remove the fan assembly 140, the user raises the handle 224 to release the cam member 228 from the locking tab 230. This allows the user to pull on the handle 224 to retract the fan assembly from the storage enclosure housing.

It is contemplated that the fan assemblies 140A-140D are hot swappable so that in the event of a failure, the storage enclosure 160 can be maintained in an operational mode while a selected one of the fan assemblies is removed and replaced. For example, with reference again to FIG. 7, the failure of fan assembly 140C can result in the removal of the failed unit while the remaining fan assemblies 140A, 140B and 140D continue to provide cooling for the enclosure 160. One problem this may present is the fact that the removal of fan assembly 140C results in a large opening at the rear of the storage enclosure housing. This opening may produce a significant loss of internal pressure and reduction in the operational efficiencies of the remaining fan assemblies.

FIGS. 11A and 11B depict a sealing door 232 that can temporarily close off the storage enclosure housing 162 upon removal of the individual fan assemblies. FIG. 11A shows the door 232 in a normally open position, and FIG. 11B shows the door 232 in a closed position.

The door 232 generally comprises a planar cover member 234 that is pivotal about a pivot shaft 236 supported by the interior of the storage enclosure housing 162. The cover member 234 is sized to substantially cover and seal off the associated opening produced by the removal of the fan assembly.

Figure 12:
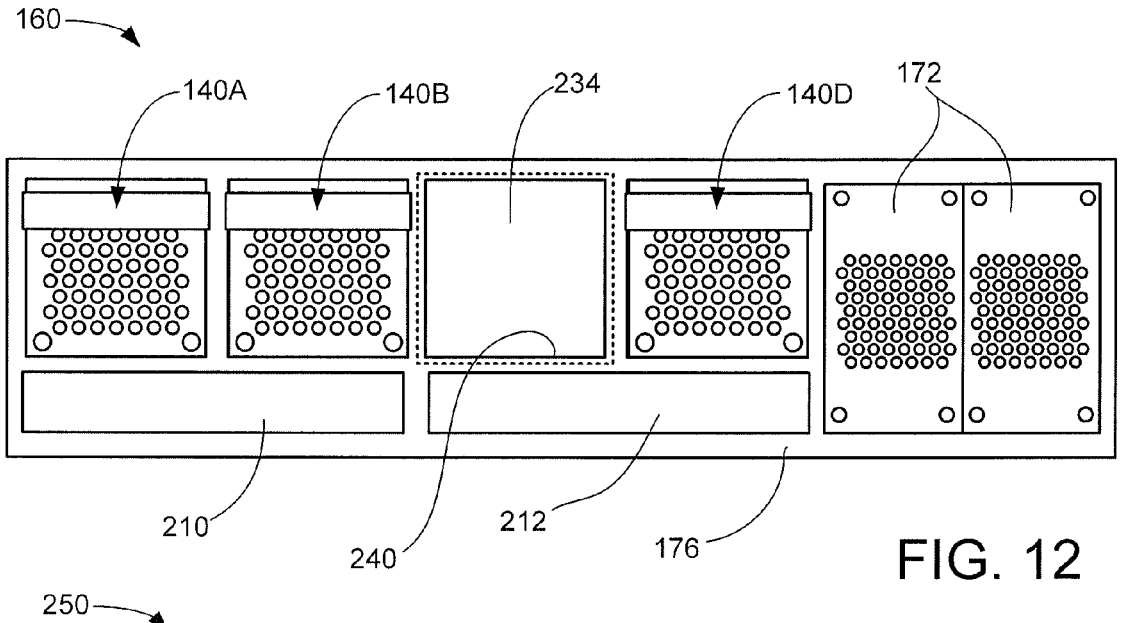
FIG. 12 is a rear view of the storage enclosure of FIG. 7 to illustrate operation of the sealing door upon removal of a selected fan assembly.

A biasing mechanism, such as coiled spring 238, applies a relatively small biasing force to urge the cover member 234 to the closed position. This biasing force is overcome through contact with the frame 142 during sliding installation of the associated fan assembly 140. FIG. 12 shows the cover member 234 in the closed position to substantially close an aperture 240 configured to accommodate the fan assembly 140C.

Figure 13:
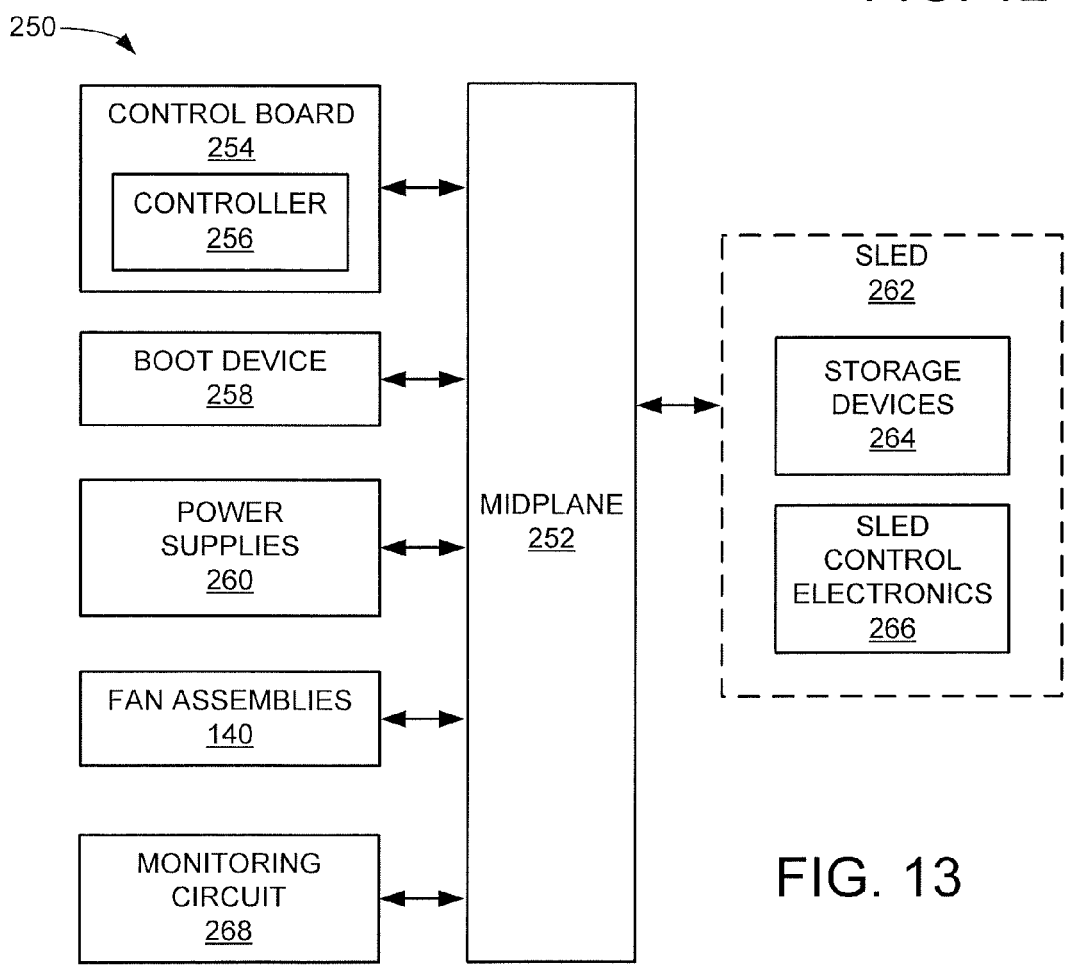
FIG. 13 is a functional block diagram of the storage enclosure of FIG. 12 in accordance with some embodiments.

FIG. 13 is a functional block representation of a storage enclosure 250 to illustrate an interplay configuration between various active elements disposed therein. The storage enclosure 250 includes a midplane 252 to provide electrical interconnections for the various elements within the enclosure. On a first (rear) side of the midplane 252 are one or more control boards 254 which house one or more controllers 256 to provide top level control of the enclosure. A boot device 258 can be used to provide a boot sequence during enclosure initialization. Power supplies 260 supply electrical power, and a plurality of the fan assemblies 140 to provide active cooling in a manner discussed above.

On an opposing second (front) side of the midplane 252 are a number of retractable sleds 262, each supporting one or more storage devices 264 and sled control electronic modules 266.

A monitoring circuit 268 may be disposed adjacent the fan assemblies 140 and provides a number of monitoring functions for the enclosure, such as control, status, and temperature levels during operation. In some embodiments, the monitoring circuit 268 detects the failure of a selected fan assembly 140, either via direct means through communications and/or monitoring of signals associated with the fan assembly or via indirect means such as through a localized increase in temperature adjacent the fan assembly.

The monitoring circuit 268 can be configured to provide an input to the controller 256 which signals, such as through an external communication link (e.g., computer 106 in FIG. 1), the need for a service event to attending personnel. A service operation can thereafter be scheduled to replace the failed fan assembly.

In further embodiments, the controller can operate to increase the output (e.g., fan speeds, etc.) of the remaining non-failed fan assemblies 140 to compensate for the temporary loss of airflow generation due to the failed fan assembly. For example, with reference again to FIG. 7, the failure of fan assembly 140C may result in an increase in the operational rate of adjacent fan assembly 140D in order to provide enhanced cooling for the control board 168 housed within tray 212. The other fan assemblies 140A, 140B may remain unaffected, or these fan assemblies may also be adjusted to higher rates of operation.

In some cases, an immediately adjacent fan assembly may be increased to a first level (e.g., from about 50% to about 100% total airflow (CFM output) rate, and other fan assemblies may be increased to a different second level (e.g., from about 50% to about 70%) to compensate for the lost fan assembly. Upon the detected installation and operation of a new, replacement fan assembly, the other fan assemblies may be returned to normal operation (e.g., 50% total airflow rate). The use of a sealing door such as 232 can enhance the efficiencies of the remaining operational fan assemblies.

Figure 14:
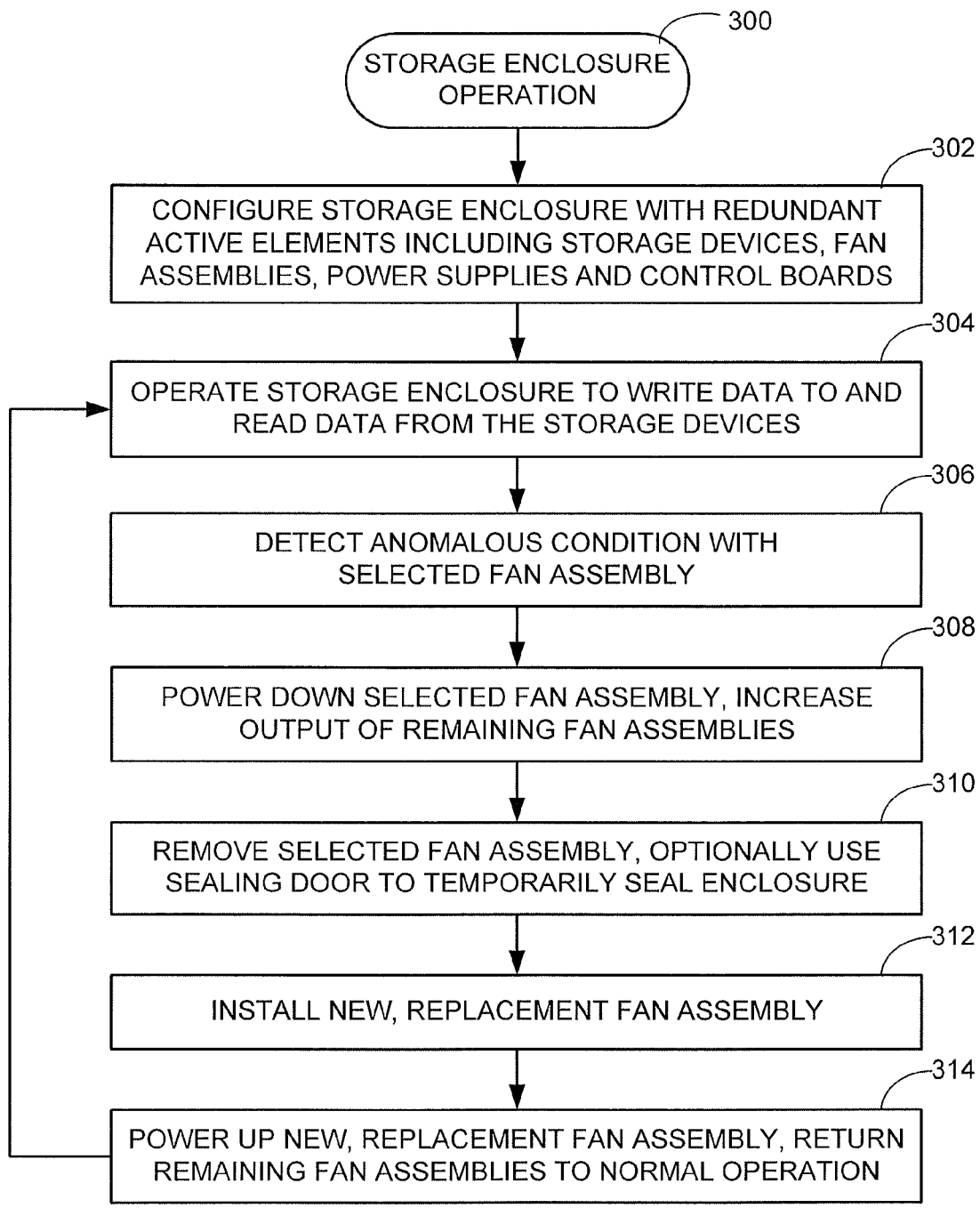
FIG. 14 is a flow chart illustrating a hot-swap service replacement cycle for a failed fan assembly in accordance with some embodiments.

FIG. 14 is a flow chart for a storage enclosure operation routine 300 to summarize the foregoing discussion. A storage enclosure such as 160, 250 is configured with various active elements at step 302 such as storage devices, power supplies, control boards and fan assemblies 140. The storage enclosure is thereafter operated at step 304 to write data to and read data from the storage devices in accordance with the dictates of the operational environment.

Upon detection of an anomalous condition for a selected fan assembly 140 at step 306, the selected fan assembly is powered down (as required) and the output of the remaining fan assemblies may be increased as discussed above, step 308.

The failed fan assembly is removed at step 310, which may include the automatic closing of a sealing door as represented in FIG. 12. A new, replacement fan assembly is slidingly installed and locked into place at step 312, and the new fan assembly is activated while the remaining active fan assemblies are returned to normal operational levels at step 314.

It will now be appreciated that the module fan assemblies as embodied herein can provide a number of benefits through active directed cooling of active elements, easy replacement of fan assemblies located in intermediate portions of a housing, and efficient mechanisms to permit hot swapping of failed fan assemblies without requiring the active elements within the housing to shut down or otherwise reduce operational loading.

The configuration and locations of the fan assemblies further enable the hot swapping of other active elements such as but not limited to storage devices, power supplies, control boards, etc. While various embodiments have been directed to a multi-device storage enclosure environment, it will be appreciated that such is merely illustrative of various embodiments and is not necessarily limiting. Rather, any number of different types of housings with active elements therein can be adapted for use of the modular fan assemblies as disclosed herein.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present disclosure.

What is claimed is:

1. An apparatus comprising:
a rigid open frame having opposing first and second ends;
a first fan connected to the first end;
a second fan connected to the second end, the first and second fans configured to establish a fluidic airflow through the frame; and
an airflow diverter positioned in an intermediate portion of the frame between the first and second ends to divert at least a portion of the fluidic airflow through a first aperture of the frame to cool an active element outside the frame.

2. The apparatus of claim 1, wherein the first and second fans each have a rectangular cross-sectional area nominally corresponding to an interior cross-sectional area of the frame in a length direction from the first end to the second end.

3. The apparatus of claim 1, further comprising an electrical connector connected to the frame and configured to engage a corresponding electrical connector on a midplane of a storage enclosure to supply electrical power to the first and second fans.

4. The apparatus of claim 1, further comprising a latching mechanism coupled to the frame which engages a housing of the storage enclosure to seat and lock the frame to the housing.

5. The apparatus of claim 1, wherein the airflow diverter comprises at least one airfoil which extends across at least a portion of an internal cross-sectional area of the frame to divert the portion of the fluidic airflow through the first aperture.

6. The apparatus of claim 5, wherein the frame further comprises a second aperture between the first aperture and the second fan to admit the portion of the fluidic airflow back into an interior of the frame for exhausting by the second fan.

7. The apparatus of claim 1, wherein the airflow diverter comprises a plurality of spaced-apart parallel airfoils which extend into an interior of the frame to divert the portion of the airflow from the first fan, the airfoils extending at an acute angle with respect to a base surface of the frame through which the first aperture extends to divert said airflow.

8. The apparatus of claim 1, further comprising a plurality of storage devices on a first side of a midplane and a control board on an opposing second side of the midplane, the midplane having a plurality of electrical interconnections to interconnect the storage devices to the control board, wherein the frame and the first and second fans are on the second side of the midplane to direct the fluidic airflow from the storage devices through the midplane.

9. The apparatus of claim 8, wherein the portion of the fluidic airflow is diverted by the airflow diverter to pass adjacent the control board.

10. The apparatus of claim 1, wherein the frame comprises a plurality of spaced apart support rails which adjoin and extend between the first and second fans and at least one support rib which extends from a first support rail to a second support rail, wherein open apertures are formed between adjacent pairs of the support rails and adjacent opposing sides of the support ribs.

11. The apparatus of claim 10, wherein the airflow diverter comprises a plurality of parallel, spaced apart airfoils each airfoil supported between an adjacent pair of the support rails and extending at a selected skew angle with respect to the support rails.

12. The apparatus of claim 10, wherein a total combined surface area of the open apertures along respective sides of the frame constitute at least 50% of a total combined surface area of the areal extent of the respective sides.

13. An apparatus comprising:
a storage enclosure housing having opposing front and rear ends, the front end adapted for placement adjacent a cold aisle zone and the rear end adapted for placement adjacent a warm aisle zone;
a plurality of data storage devices disposed within the storage enclosure housing adjacent the front end thereof; and
a plurality of fan assemblies disposed within the storage enclosure housing between the data storage devices and the rear end, each of the fan assemblies comprising a rigid open frame having a proximal end and a distal end, a first fan connected to the proximal end, a second fan connected to the distal end, the first and second fans configured to establish a fluidic airflow through the frame, and an airflow diverter positioned in an intermediate portion of the frame between the proximal and distal ends to divert at least a portion of the fluidic airflow through a first aperture of the frame to cool an active element adjacent the frame.

14. The apparatus of claim 13, further comprising a control board and a midplane disposed between the data storage devices and the fan assemblies to establish electrical interconnections between the data storage devices and the control board, wherein the fluidic airflow passes from the data storage devices, adjacent the midplane and through the frame.

15. The apparatus of claim 14, wherein the portion of the fluidic airflow diverted by the airflow diverter is directed across the control board for cooling thereof.

16. The apparatus of claim 13, further comprising at least one electrical power supply disposed within the storage enclosure housing adjacent the plurality of fan assemblies to supply electrical power to the data storage devices and to the first and second fans of each of the fan assemblies.

17. The apparatus of claim 13, wherein each of the fan assemblies further comprises a latching mechanism which uses a cam to secure the associated fan assembly within the storage enclosure housing.

18. The apparatus of claim 13, wherein the housing has an associated aperture to accommodate sliding insertion from the rear end thereof of each of the plurality of fan assemblies, and wherein the apparatus further comprises a corresponding plurality of sealing doors configured to nominally cover the associated aperture responsive to sliding removal of the associated fan assembly from the storage enclosure housing.

19. The apparatus of claim 13, further comprising a plurality of rails adapted to slidingly engage the plurality of fan assemblies during sliding insertion thereof into the data storage housing.

20. The apparatus of claim 13, further comprising a control circuit which, responsive to a detected anomalous condition associated with a first fan assembly of said plurality, increases an operational rate of the first and second fans in a second fan assembly of said plurality adjacent the first fan assembly to compensate for loss of operation of the first fan assembly.

* * * * *